United States Patent
Schwab et al.

(10) Patent No.: US 8,372,213 B2
(45) Date of Patent: Feb. 12, 2013

(54) METHOD FOR THE TREATMENT OF A SEMICONDUCTOR WAFER

(75) Inventors: Guenter Schwab, Neuoetting (DE);
Diego Feijoo, Burghausen (DE);
Thomas Buschhardt, Burghausen (DE);
Hans-Joachim Luthe, Kastl (DE);
Franz Sollinger, Polling (DE)

(73) Assignee: Siltronic AG, Munich (DE)

( * ) Notice: Subject to any disclaimer, the term of this patent is extended or adjusted under 35 U.S.C. 154(b) by 447 days.

(21) Appl. No.: 12/630,005

(22) Filed: Dec. 3, 2009

(65) Prior Publication Data
US 2010/0139706 A1 Jun. 10, 2010

(30) Foreign Application Priority Data
Dec. 10, 2008 (DE) .................. 10 2008 061 521

(51) Int. Cl.
*B08B 3/00* (2006.01)
(52) U.S. Cl. ............................ 134/28; 134/30
(58) Field of Classification Search .......... None
See application file for complete search history.

(56) References Cited

U.S. PATENT DOCUMENTS

| 5,714,203 A | 2/1998 | Schellenberger et al. |
| 2004/0069321 A1 | 4/2004 | Maleville et al. |

FOREIGN PATENT DOCUMENTS

| EP | 0817246 A2 | 1/1998 |
| EP | 0993023 A1 | 4/2000 |
| EP | 1054457 A2 | 11/2000 |
| EP | 1 168 422 A2 | 1/2002 |
| JP | 2002252201 A | 9/2002 |
| JP | 2007005665 A | 1/2007 |

*Primary Examiner* — Eric Golightly
(74) *Attorney, Agent, or Firm* — Brooks Kushman P.C.

(57) ABSTRACT

Semiconductor wafers are treated in a liquid container filled at least partly with a solution containing hydrogen fluoride, such that surface oxide dissolves, are transported out of the solution along a transport direction and dried, and are then treated with an ozone-containing gas to oxidize the surface of the semiconductor wafer, wherein part of the semiconductor wafer surface comes into contact with the ozone-containing gas while another part of the surface is still in contact with the solution, and wherein the solution and the ozone-containing gas are spatially separated such that they do not come into contact with one another.

14 Claims, 2 Drawing Sheets

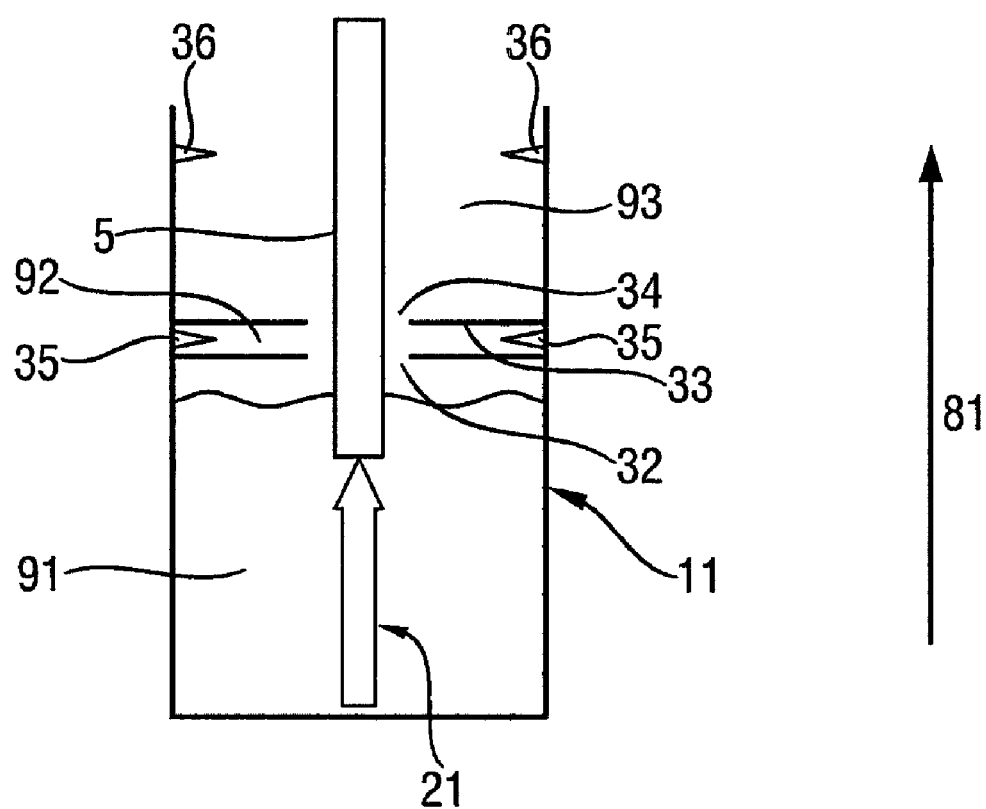

METHOD FOR THE TREATMENT OF A SEMICONDUCTOR WAFER

CROSS-REFERENCE TO RELATED APPLICATIONS

This application claims priority to German Patent Application No. DE 10 2008 061 521.8 filed Dec. 10, 2008, which is herein incorporated by reference.

BACKGROUND OF THE INVENTION

1. Field of the Invention

The invention relates to a method for the treatment of a semiconductor wafer with a solution containing hydrogen fluoride, and drying and subsequent oxidation of the surface of the semiconductor wafer with an ozone-containing gas.

2. Background Art

A series of cleaning methods have been developed for cleaning semiconductor wafers, e.g. silicon wafers. One of these cleaning methods is based on the treatment of the wafer surface with an aqueous solution of hydrogen fluoride (HF) and subsequently with ozone ($O_3$). During the treatment with HF, the native oxide is removed from the surface. A new oxide layer is thereon formed by the treatment with ozone. Fixedly adhering particles and other impurities can thereby be removed from the wafer surface. The acidic treatment in HF also brings about a very effective removal of metal ions from the wafer surface.

U.S. Pat. No. 5,714,203 describes a method in which a silicon wafer is drawn into an ozone gas atmosphere directly from a liquid tank filled with an HF solution. In this case, the silicon surface is completely freed of the surface oxide in the HF solution, and when the silicon wafer is withdrawn into the ozone atmosphere, the silicon wafer is simultaneously dried and hydrophilized, that is to say that a new oxide layer is produced on the surface. Therefore, the silicon surface outside the liquid tank is always protected by an oxide layer. The method has the disadvantage that it can only be used once or a few times when used within a complete bath cleaning installation with different cleaning solutions, since otherwise the process costs become too high (costs of the additional tanks and cumulative process times). This cost disadvantage becomes even more relevant in the case of silicon wafers having diameters of greater than 300 mm. A further disadvantage is that the undesirable binding of fluorine to the silicon surface occurs in this method. Moreover, this method leads to an increased microroughness and to the formation of haze and light scattering defects (so-called "localized light scatterers", LLS).

SUMMARY OF THE INVENTION

An object of the invention is providing an improved cleaning method using hydrogen fluoride solution and ozone which does not lead to the binding of fluorine to the surface of the semiconductor wafer, or to an increase in microroughness and the formation of haze and light scattering defects and which, even upon multiple application—is distinguished by short process times and a small installation space requirement. These and other objects are achieved by means of a method for the treatment of a semiconductor wafer, in which the semiconductor wafer is treated in a liquid container filled at least partly with a solution containing hydrogen fluoride, such that oxide situated on the surface of the semiconductor wafer dissolves, is transported out of the solution along a transport direction and dried, and is treated with an ozone-containing gas after drying, such that the surface of the semiconductor wafer is oxidized, wherein one part of the surface of the semiconductor wafer comes into contact with the ozone-containing gas while another part of the surface of the semiconductor wafer is still in contact with the solution, and wherein the solution and the ozone-containing gas are spatially separated in such a way that they do not come into contact with one another.

BRIEF DESCRIPTION OF THE DRAWINGS

FIG. 3 shows a vertical section through a device for the treatment of semiconductor wafers in accordance with a first preferred embodiment.

DETAILED DESCRIPTION OF THE PREFERRED EMBODIMENT(S)

Figure 1:
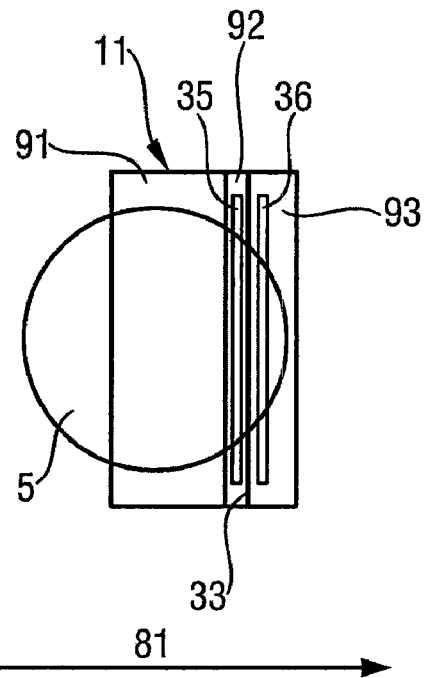
FIG. 1 shows a horizontal section through a device for the treatment of semiconductor wafers in accordance with a second preferred embodiment of the invention.

In the method according to the invention, the semiconductor wafer is treated with a solution containing hydrogen fluoride situated in a liquid container. The semiconductor wafer can either be dipped completely into the solution or can be transported through the latter. In the latter case, either the entire semiconductor wafer can come into contact with the solution simultaneously, or different regions of the semiconductor wafer are brought into contact with the solution successively in the course of transport through the liquid container, without the entire semiconductor wafer being in contact with the solution at any time.

The liquid container can be equipped with auxiliary means that improve the cleaning effect:

The liquid container can contain devices for introducing megasound, so-called transducers. Megasound supports the cleaning effect. An angle of 90° to 170° between transport direction and megasound propagation direction is preferably set in order to counteract the entrainment of particles in the transport direction of the semiconductor wafer. The megasound propagates perpendicularly to the transport direction at an angle of 90°, and largely oppositely to the transport direction at an angle of 170°, though there is still a small component perpendicular to the transport direction and thus perpendicular to the surface of the semiconductor wafer.

A further variant provides for producing and introducing gas bubbles of varying size and density into the liquid container. This can be done with the aid of pumps that intermix liquid and gas, or with the aid of micro-gas bubble producing devices (so-called micro-bubblers). Movement of the bubbles counter to the transport direction of the semiconductor wafer is advantageous.

Furthermore, it is advantageous to set the gas quantity dissolved in the liquid within the liquid container, for which purpose it is possible to use devices for the targeted introduction of gases (for example oxygen or nitrogen) or for targeted degassing.

All the abovementioned measures for further improving the cleaning effect can be implemented for the front side or the rear side of the semiconductor wafers, but most preferably for both sides.

The solution is preferably an aqueous solution of hydrogen fluoride (hydrofluoric acid). The concentration of the hydrogen fluoride is preferably 0.1 to 1% by weight (percent by weight) if the semiconductor wafer is composed of silicon. The solution can contain further constituents. It is particularly preferred to add hydrogen chloride (HCl) preferably in a concentration of 0.2 to 5% by weight, more preferably 1 to 2% by weight. This has the effect, for example, that iron is better removed from the surface and that copper is not adsorbed again on the surface. Overall, the addition of hydrogen chloride leads to more effective metal cleaning. The solution preferably contains no surfactants.

The drying of the semiconductor wafer directly after transporting it out of the hydrogen fluoride solution can be achieved by transport in an inclined state. In this case, the solution flows away from the wafer surface on account of the force of gravity. It is also possible to withdraw the semiconductor wafer vertically from the hydrogen fluoride solution, such that the solution already runs away completely from the surface of the semiconductor wafer during the withdrawal thereof, without implementing further measures for drying.

It is preferred, however, for the drying of the semiconductor wafer to be assisted by a gas being fed via one or more nozzles in a flow directed to the surface of the semiconductor wafer. An inert gas (for example nitrogen or a noble gas such as argon or mixtures thereof), is preferably used for this purpose; nitrogen ($N_2$) is particularly preferred for reasons of availability and costs. The gas is fed e.g. with the aid of a series of nozzles fitted perpendicularly to the transport direction, with sufficient density to enable complete drying. So-called flat jet nozzles are appropriate, by way of example. It is also possible to use a continuous slot arranged perpendicular to the transport direction. If necessary, it is possible to fit a plurality of series of nozzles or a plurality of slots one behind another in the transport direction in order to achieve a better drying effect. An angle between gas flow direction and wafer transport direction of between 90° (perpendicular) and 180° (antiparallel) is preferably set, more preferably between 112° and 135°, in order to repel the solution more effectively. A particular high gas flow rate is not necessary since the liquid can move easily on the hydrophobic surface. In addition, extraction of the gas by suction can also be provided.

The ozone-containing gas can also be fed in an analogous manner via one or more nozzles in a flow directed to the surface of the semiconductor wafer. This is likewise preferred. As an alternative, instead of a plurality of slotted nozzles or a plurality of series of nozzles, a longer opening as seen in the transport direction can also be used in order to increase the supply of ozone to the wafer surface and thus to achieve a more effective oxidation.

The ozone-containing gas is preferably situated in a region that is spatially separated by a partition. In this case, the semiconductor wafer in the dry state is transported into said region in the transport direction through an opening in the partition. The opening is preferably only slightly larger than the maximum cross section of the semiconductor wafer as seen in the transport direction, in order to minimize diffusion or convection of ozone through the opening.

Additional measures are preferably implemented in order to prevent ozone from penetrating into the liquid container and into the region in which hydrogen fluoride solution is still situated on the wafer surface. By way of example, when gas nozzles are used for drying, said nozzles are fitted between the liquid container and the partition. It is possible to provide at least (and preferably in addition to the nozzles directed counter to the wafer transport direction) a series of nozzles or a slotted nozzle which produces a gas flow in the direction of the opening, such that gas flows through the opening into the ozone-containing spatial region, and not vice versa. By way of example, the gas flow produced by these nozzles can form an angle of between 0° (parallel) and 90° (perpendicular) with the wafer transport direction, wherein angles of between 22° and 67° are preferred. If series of nozzles or continuous slotted nozzles fitted perpendicular to the wafer transport direction are likewise used for feeding the ozone-containing gas, then they are fitted on the other side of the partition and preferably oriented in such a way that no gas flow directed in the direction of the opening is produced. By way of example, the gas flow produced by these nozzles can likewise form an angle of between 0° (parallel) and 90° (perpendicular) with the wafer transport direction, wherein angles of between 22° and 67° are preferred.

In addition, the separation of ozone-containing gas and hydrogen fluoride solution can be assisted by suitable extraction of the two gases (i.e. of the gas used for drying and of the ozone-containing gas for hydrophilization) by suction. Thus, e.g. the extraction of the ozone-containing gas by suction can be carried out with a higher vacuum pressure.

In the method according to the invention, the treatment with hydrogen fluoride solution and the treatment with ozone-containing gas takes place in spatially separated regions. Each region of the surface of the semiconductor wafer is brought into contact with ozone only when this region has been fully dried and there is no longer any hydrogen fluoride solution on it. It has been found that fluorine is bound to the surface of the semiconductor wafer only when hydrogen fluoride and ozone act simultaneously on the surface. Therefore, the binding of fluorine to the wafer surface can be reliably avoided by the spatial separation according to the invention of hydrogen fluoride solution and ozone-containing gas.

It has additionally been found that the semiconductor wafer can be locally etched if ozone dissolves in the hydrogen fluoride solution, since the simultaneous action of ozone and hydrogen fluoride leads to removal not only of the oxide layer but also of the semiconductor material itself. When ozone and hydrogen fluoride are mixed together, locally different oxidation and oxide removal rates often occur, which lead to a nonuniform material removal and thus to an increased microroughness and to the arising of haze and light scattering defects. This problem, too, is solved by the spatial separation of ozone and hydrogen fluoride.

Both risks are particularly high if a high ozone concentration is present, which is desired, however, for effective hydrophilization. By way of example, an ozone gas flow of 200 liters/hour and an ozone gas concentration of between 80 and 100 $g/m^3$ are produced with the aid of an ozone generator. The problem is additionally intensified if the hydrogen fluoride solution is used for a relatively long time, since more and more ozone dissolves in the solution over the course of time. A relatively long use is desirable for cost reasons, however. Through the spatial separation of ozone and hydrogen fluoride, the invention permits both the use of high ozone concentrations and a relatively long use of the hydrogen fluoride solution, for example with filtration and recirculation of the solution.

Despite the spatial separation of hydrogen fluoride solution and ozone-containing gas, all of the method steps take place in a very confined space, such that when the semiconductor wafer is transported out of the hydrogen fluoride solution, a first (dry) region of the wafer surface already comes into contact with the ozone-containing gas when other regions of the wafer surface are still in contact with the hydrogen fluoride solution. A plurality of effects are obtained simultaneously in this way:

The time duration during which the dry surface of the semiconductor wafer is hydrophobic and therefore very sensitive to renewed contamination with particles is very short, preferably within the range of 1 to 5 seconds. The risk of the hydrophobic surface being contaminated with particles again is therefore low. The particle cleaning efficiency rises as a result. The process duration is very short overall, which improves the economic viability of the method. A device intended for carrying out the inventive method can be realized in an extremely space-saving fashion. This, once again, leads to an improved economic viability of the method. Even upon repeated application of the method, the process duration and the space requirement do not increase to such a great extent that the method could no longer be carried out economically.

One embodiment of the invention is illustrated in FIG. 3. In this case, an individual semiconductor wafer 5, preferably in a vertical position, is dipped into a liquid container 11 filled with a solution 91 containing hydrogen fluoride. The semiconductor wafer 5 is subsequently withdrawn from the solution 91 in a preferably perpendicular transport direction 81, such that the solution 91 already runs away completely from the surface of the semiconductor wafer 5 during the withdrawal thereof, without implementing further measures for drying, which is preferred. This procedure thus far corresponds to the teaching of U.S. Pat. No. 5,714,203. On the other hand, additional measures that prevent ozone from coming into contact with the hydrofluoric acid solution are preferably implemented. These measures will be described further below.

If necessary, in this embodiment, a gas 92 can also be fed via one or more nozzles 35 in a flow directed to the surface of the semiconductor wafer 5, in order to assist the drying of the semiconductor wafer 5. The gas 92 is fed e.g. with the aid of one or more series of nozzles arranged perpendicular to the transport direction 81, or one or more continuous slotted nozzles. An angle between gas flow direction and wafer transport direction 81 of between 90° (perpendicular) and 180° (antiparallel) is preferably set, particularly preferably between 112° and 135°, in order to repel the solution more effectively. In addition, extraction of the gas 92 by suction can also be provided.

The ozone-containing gas 93 is preferably fed via one or more nozzles 36 in a flow directed to the surface of the semiconductor wafer 5. For this purpose, it is possible to use one or more series of nozzles arranged perpendicular to the transport direction 81, or one or more slotted nozzles. As an alternative, instead of a plurality of slotted nozzles or a plurality of series of nozzles, it is also possible to use a longer opening as seen in the transport direction 81 in order to increase the supply of ozone to the wafer surface and thus to achieve more effective oxidation.

The ozone-containing gas 93 is preferably situated in a region that is spatially separated by a horizontally arranged partition 33. In this case, the semiconductor wafer 5 in the dry state is transported into this region in the transport direction 81 through an opening 34 in the partition 33. The opening 34 is preferably only slightly larger than the maximum cross section of the semiconductor wafer 5 as seen in the transport direction 81, in order to minimize diffusion or convection of ozone through the opening 34. In this embodiment, the partition 33 can either simultaneously constitute the upper boundary (cover) of the liquid container 11 or be additionally fitted above the upper boundary of the liquid container 11. The latter variant is illustrated in FIG. 3. The nozzles 36 for feeding the ozone-containing gas 93 are in any case fitted above, preferably directly above, the partition 33.

Preferably, as described above generally for the invention, additional measures are implemented in order to prevent ozone from penetrating into the liquid container and into the region in which hydrogen fluoride solution is still situated on the wafer surface.

Figure 2:
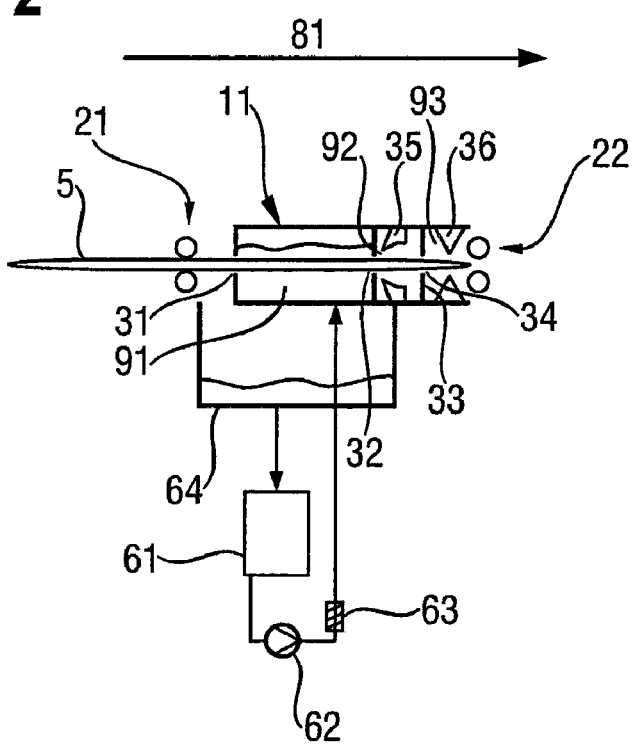
FIG. 2 shows a vertical section in the longitudinal direction through the device of FIG. 1.

In a second, particularly preferred embodiment, which is illustrated in FIGS. 1 and 2, a liquid container 11 is used, which has, in two opposite side walls, an entrance opening 31 and an exit opening 32 each lying below the surface of the hydrogen fluoride solution 91. Liquid containers of this type are described in EP817246A2. The liquid container 11 can be filled either completely or only partly with the hydrogen fluoride solution 91. The semiconductor wafer 5 is transported through the liquid container 11 along a transport direction 81 by transport devices 21, 22. In particular, the semiconductor wafer 5 is transported by a first transport device 21 in the transport direction 81 to the entrance opening 31 of the liquid container 11 and through said opening into the liquid container 11. It is then transported through the liquid container 11 from the entrance opening 31 to the exit opening 32 and, finally, it is transported away from the entrance opening 32 of the liquid container 11 in the transport direction 81 by the second transport device 22.

In order to ensure a reliable spatial separation of ozone-containing gas 93 and hydrogen fluoride solution 91, care is preferably taken to ensure that the hydrogen fluoride solution 91 does not emerge through the exit opening 32. Therefore, the exit opening 32 is preferably only slightly larger than the maximum cross section of the semiconductor wafer 5 as seen in the transport direction 81. Moreover, the semiconductor wafer 5 is preferably transported in a substantially horizontal position. In this case, the entrance 31 and exit openings 32 are slots which are arranged substantially horizontally and the height of which is preferably slightly greater than the thickness of the semiconductor wafer 5 and the length of which is slightly greater than the width of the semiconductor wafer 5. The emergence of hydrogen fluoride solution 91 can be prevented more easily in the case of a horizontal arrangement of the exit opening 32.

In addition, the measures described in EP817246A2 can be implemented in order to prevent hydrogen fluoride solution 91 from emerging from the exit opening 32 and to ensure that the semiconductor wafer 5 emerges from the liquid container 11 in the dry state.

This is preferably done by a gas 92 being fed via one or more nozzles 35 in a flow directed to the surface of the semiconductor wafer 5, in order to assist the drying of the semiconductor wafer 5. The gas 92 is fed e.g. with the aid of one or more series of nozzles arranged perpendicular to the transport direction 81, or one or more continuous slotted nozzles (as illustrated in FIG. 1). An angle between gas flow direction and wafer transport direction 81 of between 90° (perpendicular) and 180° (antiparallel) is preferably set, particularly preferably between 112° and 135°, in order to repel the solution more effectively. The nozzles 35 are preferably fitted in direct proximity to the exit opening 32. In addition, extraction of the gas 92 by suction can also be provided.

The ozone-containing gas 93, too, is preferably fed via one or more nozzles 36 in a flow directed to the surface of the semiconductor wafer 5. For this purpose, too, it is possible to use one or more series of nozzles arranged perpendicular to the transport direction 81, or one or more slotted nozzles (as illustrated in FIG. 1).

The ozone-containing gas 93 is preferably situated in a region that is spatially separated by a horizontally arranged partition 33. In this case, the semiconductor wafer 5 in the dry state is transported into this region in the transport direction 81 through an opening 34 in the partition 33. The opening 34 is preferably only slightly larger than the maximum cross section of the semiconductor wafer 5 as seen in the transport direction 81, in order to minimize diffusion or convection of ozone through the opening 34. In this embodiment, the partition 33 is fitted in addition to the lateral boundary of the liquid container 11. The nozzles 36 for feeding the ozone-containing gas 93 are in any case fitted on that side of the partition 33 which is removed from the liquid container 11. The nozzles 35 used, if appropriate, for assisting the drying of the semiconductor wafer 5 are in any case fitted between the lateral boundary of the liquid container 11 and the partition 33.

Additional measures are preferably implemented in order to prevent ozone from penetrating into the liquid container 11 and into the region in which hydrogen fluoride solution 91 is still situated on the surface of the semiconductor wafer 5. It is possible to provide at least, and preferably in addition to the nozzles 35 directed counter to the wafer transport direction, a series of nozzles or a slotted nozzle (not illustrated) which produces a flow of gas 92 in the direction of the opening 34, such that gas 92 flows through the opening 34 into the ozone-containing spatial region, and not vice versa. By way of example, the gas flow produced by these nozzles can form an angle of 0° (parallel) and 90° (perpendicular) with the transport direction 81, wherein angles of between 22° and 67° are preferred. If series of nozzles 36 or continuous slotted nozzles 36 fitted perpendicular to the transport direction 81 are likewise used for feeding the ozone-containing gas 93, then they are fitted on the other side of the partition 33 and preferably oriented such that no flow of ozone-containing gas 93 directed in the direction of the opening 34 is produced. By way of example, the gas flow produced by these nozzles 36 can likewise form an angle of between 0° (parallel) and 90° (perpendicular) with the wafer transport direction, wherein angles of between 22° and 67° are preferred. Suitable extraction of the ozone-containing gas 93 by suction can likewise contribute to avoiding diffusion or convection of the ozone-containing gas 93 through the opening 34 in the partition 33.

A flow of the hydrogen fluoride solution opposite to the transport direction 81 is preferably produced in the liquid container 11 in order to counteract the entrainment of particles to the exit opening 32 of the liquid container 11. This can be achieved by means of correspondingly oriented nozzles (not illustrated) within the liquid container 11.

It is additionally preferred for the hydrogen fluoride solution 91 to flow away through the entrance opening 31 or to be discharged within the liquid container 11 in the vicinity of the entrance opening 31. In this case, it can be collected, filtered and returned to the liquid container 11. If a plurality of liquid containers are connected in series, the hydrogen fluoride solution is preferably collected separately for each liquid container, filtered and returned to the relevant liquid container. FIG. 2 schematically illustrates an associated collecting trough 64 that collects the hydrogen fluoride solution 91 draining from the liquid container 11. From the collecting trough 64, the hydrogen fluoride solution 91 can be conducted into a supply container 61 and be returned to the liquid container 11 via a pump 62 and a filter 63. By means of the filtration and return, the particle concentration can be kept at a low level for a long time. The separate collection, filtration and return for each liquid container is advantageous since, in this way, a particularly low particle and metal concentration can be maintained in the last liquid containers through which the semiconductor wafers pass. It is thus possible to lengthen the service life of a liquid filling until the hydrogen fluoride solution 91 is completely exchanged again, without impairing the cleaning result. Conversely, the cleaning result can be improved given the same time intervals for complete exchange.

The width of the liquid container 11 measured perpendicular to the transport direction 81 of the semiconductor wafer 5 is preferably greater than its length measured in the transport direction 81. In particular, the liquid container 11 is dimensioned such that its width is greater than the width of the semiconductor wafer 5 to be treated therein, such that the semiconductor wafer 5 finds space in terms of width in the liquid container 11. By contrast, the length of the liquid container 11 in the transport direction 81 of the semiconductor wafer 5 is preferably less than the length of the semiconductor wafer 5, such that the semiconductor wafer 5, in the direction of its length, can never be situated completely within the liquid container 11. If the semiconductor wafer 5 is substantially round, "length" and "width" of the semiconductor wafer 5 should in each case be equated with its diameter.

These preferred size relationships make it possible to dispense with guide elements arranged within the liquid container 11, since a semiconductor wafer 5 transported through the liquid container 11 can at any time be held and transported further by at least one of the two transport devices 21, 22 adjoining the liquid container 11.

At the beginning of the method, the semiconductor wafer 5 is taken from a cassette for example and positioned on the first transport device 21. This is preferably effected automatically by a robot. It is subsequently preferably fixed perpendicular to the transport direction 81 by the first transport device 21 and transported in the transport direction 81 to the entrance opening 31 of the first liquid container 11 and through the opening into the first liquid container 11.

While it is transported from the entrance opening 31 to the exit opening 32 through the first liquid container 11, the part of the semiconductor wafer 5 which is situated within the liquid container 11 preferably comes into contact exclusively with the hydrogen fluoride solution 91 since the liquid container 11 preferably contains no guide elements that support the semiconductor wafer 5 and would therefore shield portions of the wafer from the hydrogen fluoride solution. This is possible when the liquid container 11, as described above, is smaller than the semiconductor wafer 5 as seen in the transport direction 81, such that the semiconductor wafer 5, during its transport through the liquid container 11, can at any time be fixed perpendicular to the transport direction 81 by the first 21 or second transport device 22 or by both and be simultaneously transported further in the transport direction 81. While the semiconductor wafer 5 is transported through the liquid container 11, it can already be accepted by the second transport device 22 as long as it is still in contact with the first transport device 21. The second transport device 22, situated on the opposite side of the liquid container 11, preferably fixes the semiconductor wafer 5 once again perpendicularly to the transport direction 81 and transports it away from the exit opening 32 of the liquid container 11 in the transport direction 81. If a second liquid container is present, then the transport device 22 transports the semiconductor wafer 5 to the entrance opening of the second liquid container and through said opening into the second liquid container.

Depending on the required cleaning performance, in the second embodiment of the invention, any desired number of cleaning units (liquid containers with corresponding drying devices, feeding devices for the ozone-containing gas and transport devices) can be connected in series, where an excessively large number is detrimental to the economic viability and does not entail an appreciable improvement in the cleaning performance. The number of cleaning units is preferably at least two and at most ten, and four to eight cleaning units of identical type are particularly preferred. If a plurality of cleaning units are used, then they are arranged along a transport path on which the semiconductor wafers are transported through the device. The transport path need not necessarily be a straight route; it can be curved generally or at specific locations. The transport path is defined by the liquid containers and the transport devices situated before the first liquid container, between two respective liquid containers and after the last liquid container. The expressions "before" and "after" are merely derived from the temporal sequence in which the semiconductor wafers are transported through the individual liquid containers, but they are used for the description of a spatial arrangement.

The liquid in the second liquid container is always contaminated with particles and metals to a lesser extent than the liquid in the first liquid container. The particle and metal concentration decreases further in any further liquid container. Since, a number of times, the oxide is removed at the surface of the semiconductor wafer and a new oxide layer is produced again and therefore overall a thicker layer is removed from the surface of the semiconductor wafer, the metal purification is likewise improved. By cascading at least two cleaning steps of identical type which proceed in two separate liquid containers, the cleaning effect can therefore be significantly improved by comparison with the prior art, with a process duration unchanged overall. The cascading of a plurality of liquid containers—without appreciably impairing the economic viability of the method—is only made possible by this embodiment of the invention since, on account of the small length of the individual liquid containers, the space requirement overall does not increase or increases only to an insignificant extent. At the same time, the small length of the individual liquid containers makes it possible to transport the semiconductor wafers without guide elements within the liquid containers. Since the semiconductor wafers are treated individually and, moreover, are not shielded by guide or holding devices within the liquid containers, the cleaning efficiency again increases—without increasing the treatment duration or the space requirement. The method according to the invention can be operated continuously, which has a positive effect on the throughput. Moreover, front side and rear side of the semiconductor wafers can be treated in an identical manner. A further advantage of this embodiment is that it can also be applied to semiconductor wafers having a large diameter of 300 mm or more, for example 450 mm, without appreciable lengthening of the process duration.

The transport devices 21, 22 used are preferably transport rollers composed of a suitable material (e.g. polyvinyl alcohol, PVA) which, preferably in the moist state, slightly press the semiconductor wafer 5 on both sides and move it further in the transport direction 81 with the aid of a motor. In this embodiment, the liquid container 11 (or the plurality of liquid containers) is preferably dimensioned to be less than half as long as the semiconductor wafer 5, in order that individual roller pairs (one roller above and the other below the semiconductor wafer 5) before and after the liquid container 11 or between the plurality of liquid containers are sufficient to enable at any time a sufficient support of the semiconductor wafer 5 and thereby a contactless transport of the semiconductor wafer 5 within the liquid container 11. This embodiment is illustrated by way of example in FIG. 2. A transport device can also comprise two or more roller pairs; preferably, however, in each case precisely one roller pair is used before and after the liquid container 11 or between two respective liquid containers. At least one roller of each transport device has to be driven by a motor in order to be able to transport the semiconductor wafer. The other rollers of the transport device can either likewise be driven by a motor and actively transport the semiconductor wafer, or it is possible for them not to be driven and only to fix the semiconductor wafer perpendicularly to the transport direction.

Other transport mechanisms can be used as an alternative to the rollers. Thus, the semiconductor wafers can also be passed on by mechanical grippers on both sides of the liquid container. Transport via water cushions is also possible, in the case of which the semiconductor wafers lie on a liquid film and are advanced with the aid of nozzles.

After the (final) oxidation of the semiconductor wafer, the latter is removed preferably contactlessly or at least with the smallest possible contact area. Thus, the semiconductor wafer can be removed e.g. with the aid of a so-called ultrasonic gripper, with the aid of which the semiconductor wafer floats contactlessly.

All the described types of transport devices can be operated at a constant or variable speed. The semiconductor wafers are preferably transported one directly behind another with a small spacing.

The invention can be applied to all types of semiconductor wafers, to multi- or polycrystalline semiconductor wafers (which are used for photovoltaic applications, for example), and likewise to monocrystalline semiconductor wafers (for example microelectronics). The semiconductor wafers can be composed of any desired semiconductor materials which are oxidized by ozone and the oxides of which are dissolved by hydrogen fluoride, such as silicon for example.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for the treatment of a semiconductor wafer having a thickness and a width, comprising:
    treating the semiconductor wafer in a liquid container filled at least partly with a solution containing HF, such that oxide situated on the surface of the semiconductor wafer dissolves,
    transporting the semiconductor wafer out of the solution along a transport direction and drying the semiconductor wafer to form a semiconductor wafer with dry portions, and
    treating only the dry portions of the semiconductor wafer with an ozone-containing gas after drying, such that the dry portions of the semiconductor wafer are oxidized,
wherein one part of the surface of the semiconductor wafer comes into contact with the ozone-containing gas while another part of the surface of the semiconductor wafer is still in contact with the solution, wherein the solution and the ozone-containing gas are spatially separated such that they do not come into contact with one another, wherein the ozone-containing gas is situated in a region that is spatially separated from the solution by means of a partition, and wherein the semiconductor wafer in the dry state is transported into said region in the transport direction through the partition.

2. The method of claim 1, wherein the drying of the semiconductor wafer is assisted by an inert gas fed via one or more nozzles in a flow directed to the surface of the semiconductor wafer.

3. The method of claim 1, wherein the ozone-containing gas is fed via one or more nozzles in a flow directed to the surface of the semiconductor wafer.

4. The method of claim 2, wherein the ozone-containing gas is fed via one or more nozzles in a flow directed to the surface of the semiconductor wafer.

5. The method of claim 1, wherein the semiconductor wafer is transported through the liquid container along a transport direction by transport devices wherein the liquid container has, in two opposite side walls, an entrance opening and an exit opening each lying below the surface of the solution.

6. The method of claim 5, wherein the semiconductor wafer is transported in a substantially horizontal position, and wherein the entrance and exit openings are slots which are arranged substantially horizontally, the slots having a height which is only slightly greater than the thickness of the semiconductor wafer and the slots having a length which is only slightly greater than the width of the semiconductor wafer.

7. The method of claim 5, wherein the solution flows away through the entrance opening and is subsequently collected, filtered and returned to the liquid container, or is discharged within the liquid container in a vicinity of the entrance opening, and is subsequently collected, filtered and returned to the liquid container.

8. The method of claim 6, wherein the solution flows away through the entrance opening and is subsequently collected, filtered and returned to the liquid container, or is discharged within the liquid container in a vicinity of the entrance opening, and is subsequently collected, filtered and returned to the liquid container.

9. The method of claim 1, wherein a width of the liquid container in the transport direction is less than the width of the semiconductor wafer in the transport direction.

10. The method of claim 1, wherein following transport of the semiconductor wafer out of the solution, the wafer is dried by impingement of inert gas through one or more drying nozzles positioned beyond an exit from a bath through which the wafer is transported, the wafer with dry portions passes through a slotted partition, and beyond the slotted partition, the wafer with dry portions is contacted with ozone gas, the slotted partition preventing ozone gas from reaching the exit of the bath.

11. The method of claim 10, where the drying nozzles are slot nozzles.

12. The method of claim 11, wherein the contact of the wafer with dry portions with ozone gas is achieved by directing ozone-containing gas through slot nozzles toward surfaces of the wafer.

13. The method of claim 1, wherein the solution containing HF also contains hydrogen chloride.

14. The method of claim 2, wherein the inert gas is selected from the group consisting of nitrogen, the noble gases, and mixtures thereof.

* * * * *